US009892890B2

(12) United States Patent
Bluck et al.

(10) Patent No.: US 9,892,890 B2
(45) Date of Patent: Feb. 13, 2018

(54) NARROW SOURCE FOR PHYSICAL VAPOR DEPOSITION PROCESSING

(71) Applicant: Intevac, Inc., Santa Clara, CA (US)

(72) Inventors: Terry Bluck, Santa Clara, CA (US); Alex Riposan, Palo Alto, CA (US)

(73) Assignee: INTEVAC, INC., Santa Clara, CA (US)

( * ) Notice: Subject to any disclaimer, the term of this patent is extended or adjusted under 35 U.S.C. 154(b) by 697 days.

(21) Appl. No.: 13/871,936

(22) Filed: Apr. 26, 2013

(65) Prior Publication Data

US 2013/0284594 A1 Oct. 31, 2013

Related U.S. Application Data

(60) Provisional application No. 61/639,047, filed on Apr. 26, 2012.

(51) Int. Cl.
*H01J 37/34* (2006.01)
*C23C 14/56* (2006.01)
(Continued)

(52) U.S. Cl.
CPC ...... *H01J 37/3423* (2013.01); *C23C 14/3407* (2013.01); *C23C 14/352* (2013.01);
(Continued)

(58) Field of Classification Search
CPC .............. C23C 14/568; C23C 14/3414; C23C 14/3407; C23C 14/56; C23C 14/566;
(Continued)

(56) References Cited

U.S. PATENT DOCUMENTS 4,198,283 A * 4/1980 Class .................. H01J 37/3408
204/192.12
4,209,375 A * 6/1980 Gates ................. B23K 35/3013
204/192.15
(Continued)

FOREIGN PATENT DOCUMENTS

CN 104583454 A 4/2015
DE 4223091 C1 7/1993
(Continued)

OTHER PUBLICATIONS

International Search Report and Written Opinion for PCT/US2013/038531 dated Sep. 17, 2013.
(Continued)

*Primary Examiner* — Michael Band
(74) *Attorney, Agent, or Firm* — Wombie Bond Dickinson (US) LLP; Joseph Bach, Esq.

(57) ABSTRACT

A narrow sputtering source and target which are designed to be installed in a series on a sputtering chamber. Each of the narrow sputtering sources has length sufficient to traverse one direction of the sputtering zone, but is much narrower than the orthogonal direction of the sputtering zone. When the sputtering chamber performs a pass-by sputtering process, each of the narrow sputtering sources is sufficiently long to traverse the sputtering zone in the direction orthogonal to the substrate travel direction, but is much narrower than the sputtering zone in the direction of substrate travel. Several narrow sputtering sources are installed so as to traverse the entire sputtering zone in all directions.

20 Claims, 7 Drawing Sheets

(51) Int. Cl.
*C23C 14/35* (2006.01)
*C23C 14/34* (2006.01)
*H01J 37/32* (2006.01)

(52) U.S. Cl.
CPC ............ *C23C 14/56* (2013.01); *C23C 14/566* (2013.01); *H01J 37/32779* (2013.01); *H01J 37/3411* (2013.01); *H01J 37/3417* (2013.01); *H01J 37/3435* (2013.01); *H01J 37/3497* (2013.01); *H01J 37/3408* (2013.01)

(58) Field of Classification Search
CPC ............ C23C 14/352; H01J 37/32779; H01J 37/3411; H01J 37/3417; H01J 37/3497; H01J 37/3435; H01J 37/3423
See application file for complete search history.

(56) References Cited

U.S. PATENT DOCUMENTS

| | | | | |
|---|---|---|---|---|
| 5,071,535 | A | * | 12/1991 | Hartig ................ C23C 14/3407 204/298.09 |
| 5,403,458 | A | * | 4/1995 | Hartig ................ C23C 14/3414 204/192.15 |
| 5,421,978 | A | | 6/1995 | Schuhmacher et al. |
| 5,985,115 | A | * | 11/1999 | Hartsough .......... H01J 37/3408 204/298.09 |
| 6,093,293 | A | | 7/2000 | Haag et al. |
| 6,740,585 | B2 | | 5/2004 | Yoon et al. |
| 2002/0000272 | A1 | | 1/2002 | Segal et al. |
| 2002/0036133 | A1 | | 3/2002 | Haag et al. |
| 2002/0160622 | A1 | | 10/2002 | Yamazaki et al. |
| 2003/0029715 | A1 | | 2/2003 | Yu et al. |
| 2005/0145478 | A1 | | 7/2005 | Tepman |
| 2005/0178662 | A1 | * | 8/2005 | Wurczinger ........ H01J 37/3497 204/298.21 |
| 2008/0302656 | A1 | * | 12/2008 | Henrich ................ C23C 14/50 204/298.23 |
| 2009/0020192 | A1 | | 1/2009 | Segal et al. |
| 2010/0313809 | A1 | * | 12/2010 | Guo ..................... C23C 14/566 118/50 |

FOREIGN PATENT DOCUMENTS

| | | |
|---|---|---|
| EP | 0393344 A1 | 10/1990 |
| EP | 2841619 A1 | 3/2015 |
| JP | 2009-52094 A | 3/2009 |
| JP | 2015-518090 A | 6/2015 |
| KR | 10-2015-0048089 A | 5/2015 |
| TW | 200535267 A | 11/2005 |
| TW | 201348484 A | 12/2013 |
| TW | I515320 B | 1/2016 |
| WO | 2013/163623 A1 | 10/2013 |

OTHER PUBLICATIONS

International Preliminary Report on Patentability for PCT/US2013/038531 dated Mar. 31, 2014.
Extended Search Report for European Patent Application No. 13781653.4 dated May 6, 2015.
Office Action for Taiwanese Patent Application No. 102115001 dated Nov. 14, 2014.
Notice of Allowance for Taiwanese Patent Application No. 102115001 dated Aug. 31, 2015.
First Office Action for Chinese Patent Application No. 201380027899.X dated Feb. 3, 2016.

\* cited by examiner

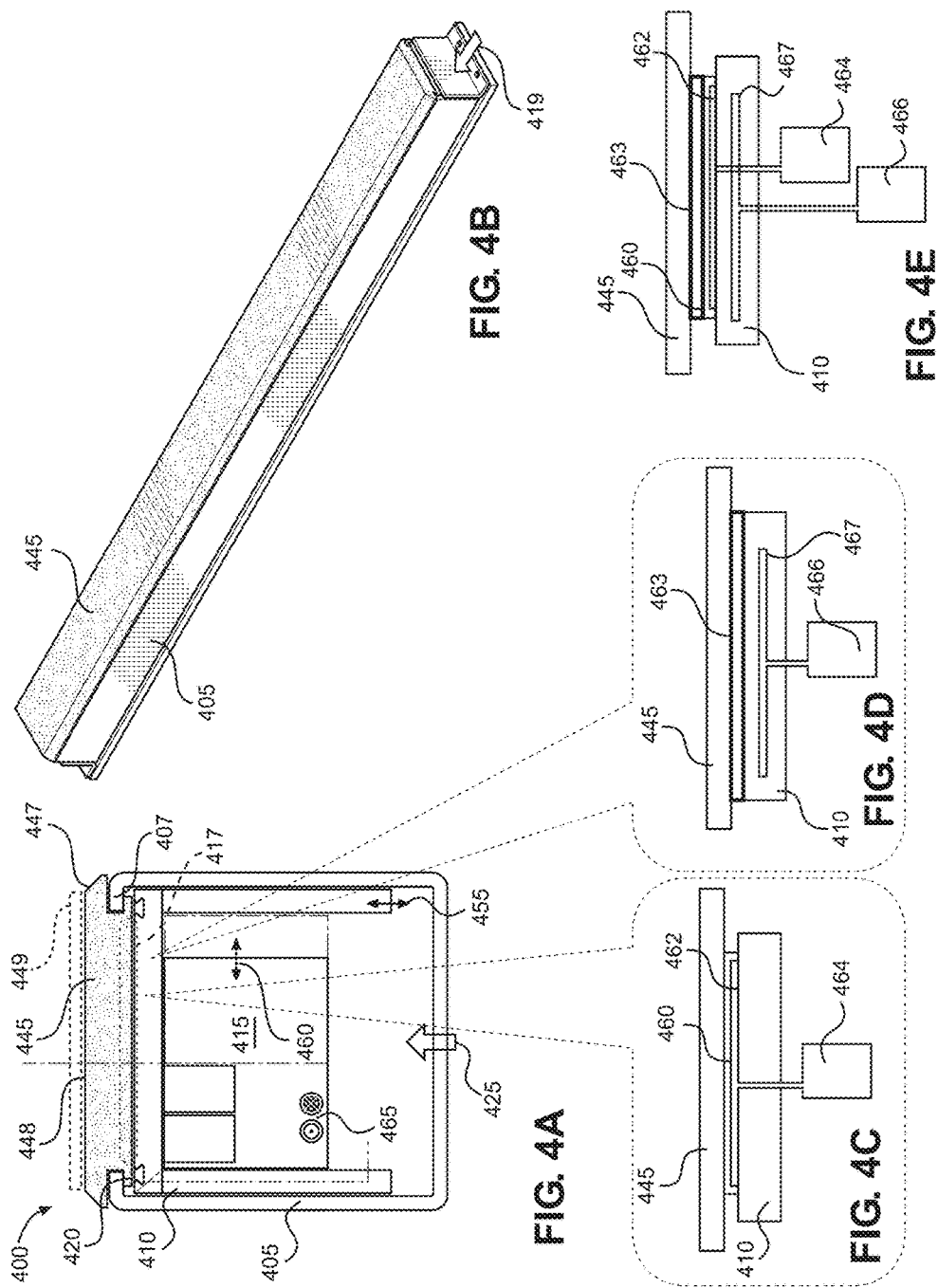

NARROW SOURCE FOR PHYSICAL VAPOR DEPOSITION PROCESSING

RELATED APPLICATIONS

This applications claims priority benefit from U.S. Provisional Application Ser. No. 61/639,047, filed on Apr. 26, 2012, the entire disclosure of which is incorporated herein by reference.

BACKGROUND

1. Field

This application relates to systems for physical vapor deposition processing, such as sputtering systems used in the fabrication of solar cells, flat panel displays, touch screens, etc.

2. Related Art

Various systems are known in the art for fabricating semiconductor IC's, solar cells, touch screens, etc. The processes of these systems are conducted in vacuum and include, e.g., physical vapor deposition (PVD—also referred to as sputtering), chemical vapor deposition (CVD), ion implant, etch, etc. There are two basic approaches for such systems: single-substrate processing or batch processing. In single wafer processing, only a single substrate is present inside the chamber during processing. In batch processing several substrates are present inside the chamber during processing. In the fabrication of flat panel displays and other large substrates, even a single substrate may require a correspondingly large source, e.g., sputtering source and target. Similarly, a large source and target is needed when processing a batch of several smaller substrates simultaneously.

Large sputtering sources are complex and expensive to manufacture. They require complex design of magnetron, cooling system, etc. Also, due to their sheer size they are difficult to maintain. Moreover, the target becomes very expensive to manufacture and leads to underutilization due to the difficulties in uniformly sputtering from the entire surface of a large target. This increases the cost of ownership of such systems.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention provide a sputtering source that is easy and chap to manufacture. Additionally, the sputtering source utilizes a very simple and inexpensive target. Embodiments disclosed provide a sputtering source and target that are easy to service and have high utilization. Target replacement is easy and fast, reducing the time the system is off line for service.

The sputtering source and target is configured for installation in a sputtering chamber as part of a series of several such sources, traversing the required sputtering length. Such an arrangement is superior to standard sputtering sources which are installed individually in a chamber and are sized to traverse the entire sputtering length.

Disclosed embodiments provide for a sputtering chamber configured for processing a plurality of substrates simultaneously, the plurality of substrates arranged in a two dimensional array traversing a width and length of a processing zone, the chamber having a wall configured for accepting a plurality of narrow sputtering sources, each of the narrow sputtering sources having width that is narrower than either the width or the length of the processing zone, and each of the narrow sputtering sources having length that is the same as the width or the length of the sputtering zone. Each of the sputtering sources has a housing that consists of a folded sheet of metal, providing a rectangular cross-section having a window over the entire length of one side of the rectangular cross-section. The width of the window is narrower than the entire side of the rectangular cross-section, such that two extensions extend inwardly into the window. An elongated target is formed with one groove on each side thereof, such that the target can be slid over the window with the extensions being accommodated inside the grooves. The target is cooled by a heat sink that is urged against the backside of the target by a pneumatic pressure. The pressing of the heat sink against the target also fixes the target in place and prevents the target from sliding.

The disclosed arrangement enables a simple method for replacing sputtering targets, since the target is not bonded to the heat sink, as prior art. Specifically, to replace a target, the pneumatic pressure is relieved, such that the heat sink ceases its pressure on target. The target can then be slid off of the source housing. A new target is then slid on the housing with its grooves riding on the extensions. The pneumatic pressure is then resumed, such that the heat sink presses against t target and it in place. It should be appreciated, that the same process and same arrangement can be implemented using actuators that urge the heat sink against the target, instead of using pneumatic pressure.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A illustrates an example of a system wherein the carriers remain in a horizontal orientation during transport and processing, while

FIG. 4A illustrates a cross section of a sputtering source according to one embodiment.

FIG. 4B is an isometric view of a sputtering source according to one embodiment.

FIG. 4C is a close-up of a heat sink arrangement according to another embodiment.

FIG. 4D is a close-up of a heat sink arrangement according to yet another embodiment.

FIG. 4E is a close-up of a heat sink arrangement combining features of FIGS. 4C and 4D.

DETAILED DESCRIPTION

The following detailed description provides examples that highlight certain features and aspects of the innovative sputtering source and target claimed herein. Various disclosed embodiments provide for a narrow sputtering source, having with generally narrower than the substrate to be processed. The narrow source is designed to be installed on the processing chamber in multiple units, side by side, such that the total width covered by all of the narrow sources covers the required sputtering field of view. To understand the context of the narrow sputtering source, the description begins with describing a processing system having a sputtering chamber.

Figure 1:
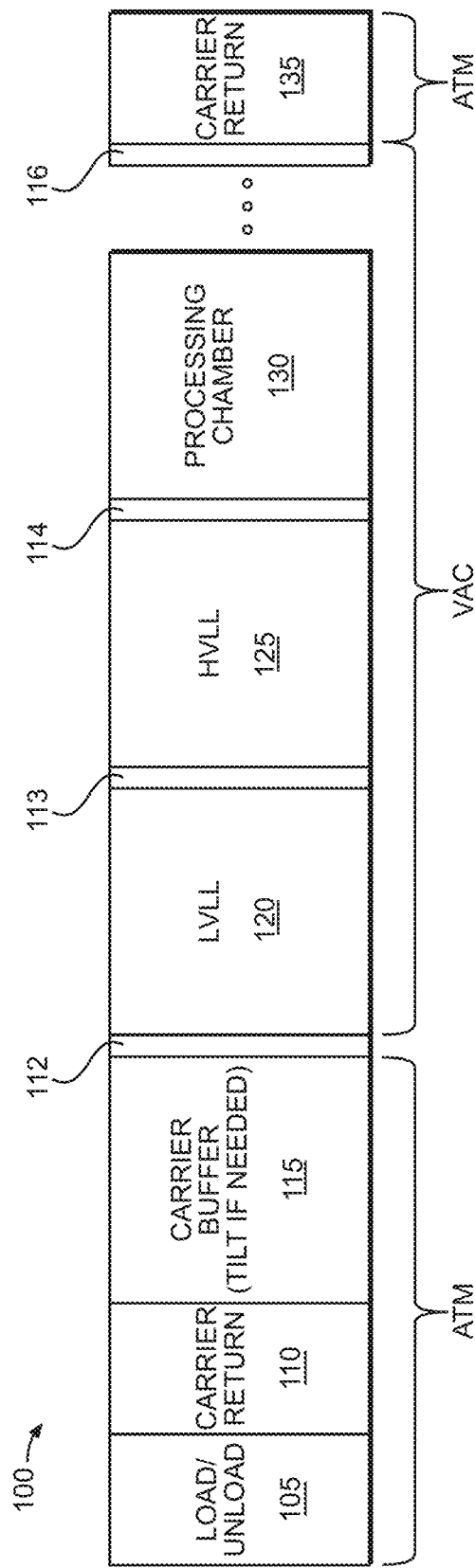
FIG. 1 illustrates an embodiment of a multi-substrate processing system having at least one sputtering chamber.

FIG. 1 is a top-view illustration of an embodiment of a multi-substrate processing system, wherein transport carriers support a line-array of substrates, but processing is performed on a two-dimensional array of substrates. However, the narrow sputtering source can also be used with system designed for processing single large substrates, such as glass for flat panel displays. In the system 100 illustrated in FIG. 1, the substrates are loaded and unloaded at load/unload station 105, i.e., from the same side of the system. However, it should be appreciated that the system may also be designed such that a loading station is provided on one side of the system, while an unloading station is provided on the opposite side of the system. In some embodiments, loading and/or unloading of substrates onto/from the carriers may be performed manually, while in others automation is provided to perform one or both of these tasks.

The substrates are loaded onto carriers positioned in load/unload station 105, and which were transported from carrier return station 110. Each carrier supports a linear array of substrates, i.e., two or more substrates arranged in a single row, in a direction perpendicular to the direction of travel inside the system. From load/unload station 105 the carriers are moved via the carrier return station 110 to buffer station 115. The carriers are parked in buffer station 115 until the low vacuum loadlock (LVLL) 120 is ready to accept them. In some embodiments, which will be described later, the buffer station also serves as the tilting station, wherein horizontally oriented carriers are tilted 90° to assume a vertical orientation. In such embodiments, clips are used to hold the substrate in place when assuming a vertical orientation.

At the proper time, valve 112 opens and the carriers positioned in buffer station 115 are transported into LVLL 120. Valve 112 is then closed and the LVLL 120 is evacuated to a rough vacuum level. Thereafter valve 113 opens and the carriers from LVLL 120 are transported into high vacuum loadlock (HVLL) 125. Once HVLL has been pumped to its vacuum level, valve 114 opens and the carriers from HVLL 125 are transported into processing chamber 130. The system may have any number of processing chambers 130 aligned linearly such that the carriers may be transported from one chamber to the next via a valve positioned between each two processing chambers. At the end of the last processing chamber, a valve is positioned that leads to the reverse loadlock arrangement as in the entrance to the system, i.e., first a HVLL and then a LVLL. Thereafter the carriers exit to the carrier return module 135 via valve 116. From return module 135 the carriers are returned to carrier return station 110 using, e.g., conveyor positioned above or below the processing chambers 130 (not shown).

As noted above, each carrier supports a linear array of substrates, which makes it easier to load and unload the substrates, and makes the carriers much easier to manufacture, handle, and transport. However, in order to have high throughput of the system, each processing chamber 130 is configured to house and simultaneously process a two-dimensional array of substrates positioned on several, i.e., two or more, carriers positioned one after the other. For better efficiency, in the embodiment of FIG. 1, buffer station 115, LVLL 120 and HVLL 125 are each configured to simultaneously house the same number of carrier as are simultaneously housed inside the processing chamber 130. For example, each carrier may support three glass substrates in one row, but each processing chamber is configured to process two carriers simultaneously, thus processing a two-dimensional array of 3×2 substrates.

As shown in FIG. 1, the parts of the system dedicated for transport, loading and unloading of substrates are positioned in atmospheric environment. On the other hand, all processing is performed in vacuum environment. Transport, loading and unloading in atmospheric environment is much easier than in vacuum.

Figure 1A:
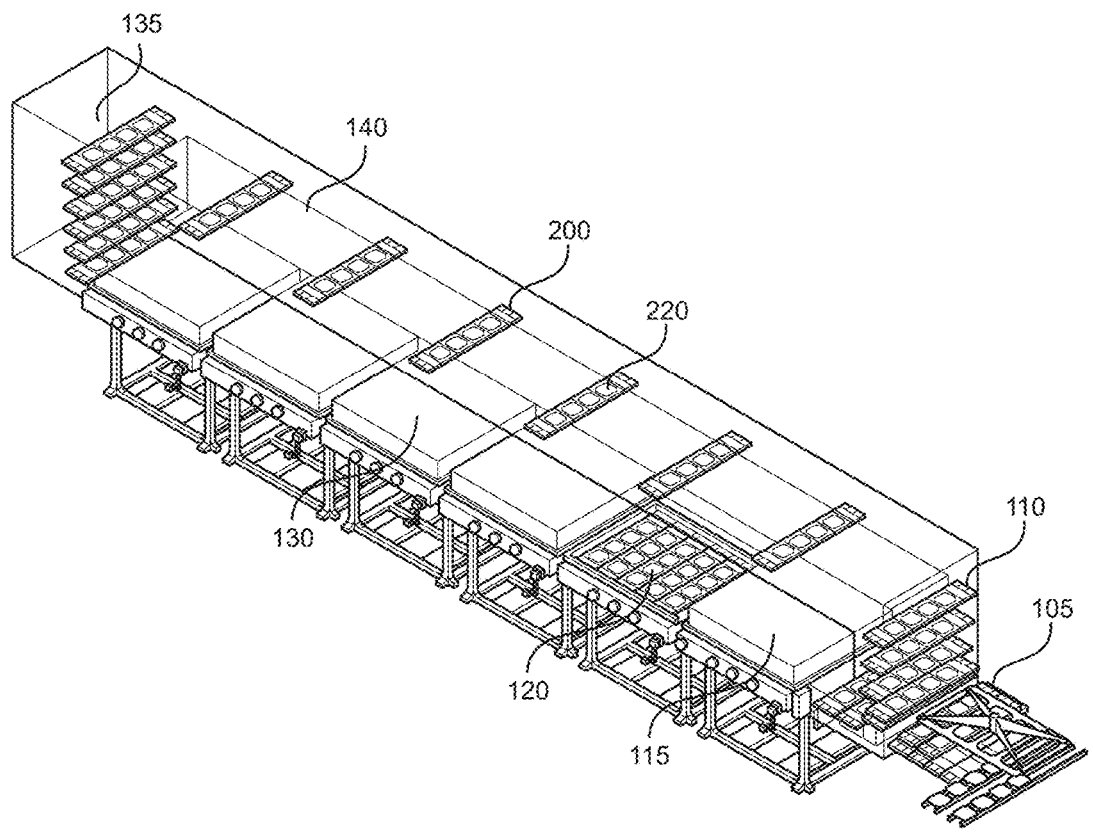

FIG. 1A illustrates an example of a system, such as that shown in FIG. 1, wherein the carriers 200 remain in a horizontal orientation during transport and processing. The carriers are returned to the starting point via conveyor 140 positioned above the processing chambers. As shown in FIG. 1A, each carrier 200 supports four substrates 220 arranged linearly in one row. Also, for explanation purposes, the top part of chamber 120 is removed, so as to expose the arrangement of six carriers positioned simultaneously therein. Therefore, according to this embodiment, while each carrier supports four substrates, each chamber process twenty-four substrates simultaneously.

Figure 1B:
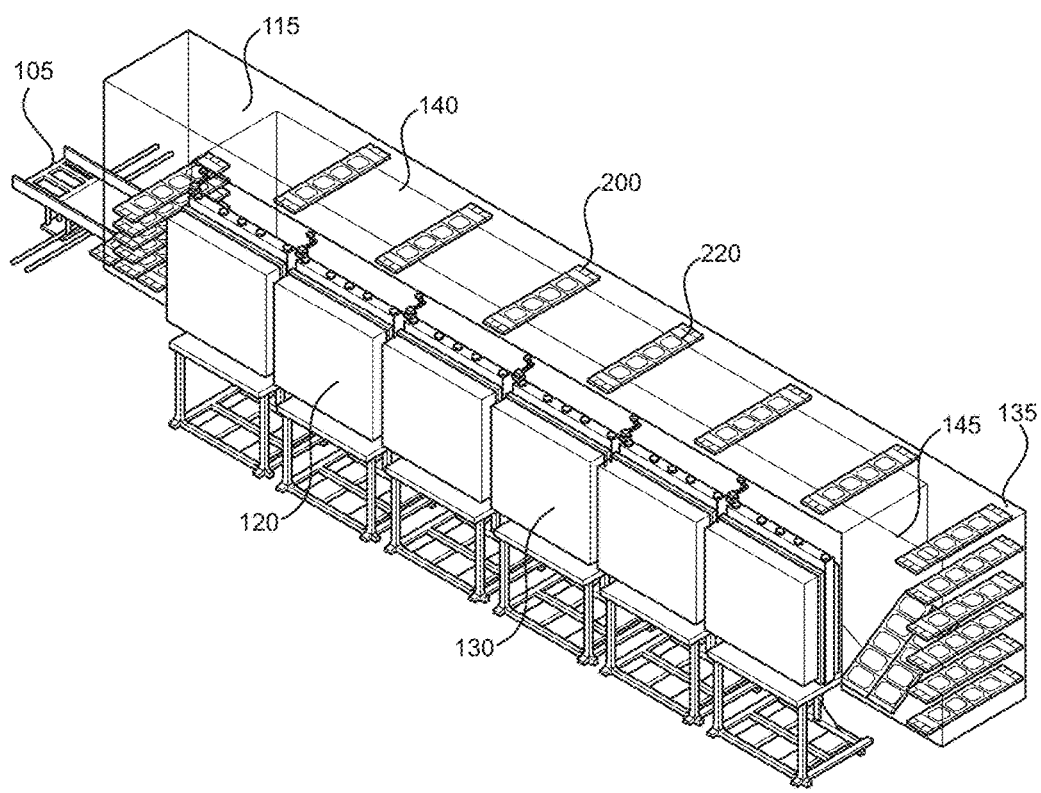
FIG. 1B illustrates an example wherein the carriers are horizontal during transport and loading/unloading, but are vertical during processing.

FIG. 1B illustrates an example wherein the carriers are horizontal during transport and loading/unloading, but are vertical during processing. The arrangement of FIG. 1B is very similar to that of FIG. 1A, except that the loadlock and processing chambers are flipped vertically, so as to process the substrates in a vertical orientation. The construction of loadlock and processing chambers in both embodiments of FIGS. 1A and 1B may be identical, except that in FIG. 1A they are mounted horizontally, while in FIG. 1B they are mounted on their side vertically. Consequently, the buffer stations 115 and the buffer station 145 on the other end of the system are modified to include a lifting arrangement which changes the orientation of the carriers 90°, as shown in buffer station 145.

Figure 2:
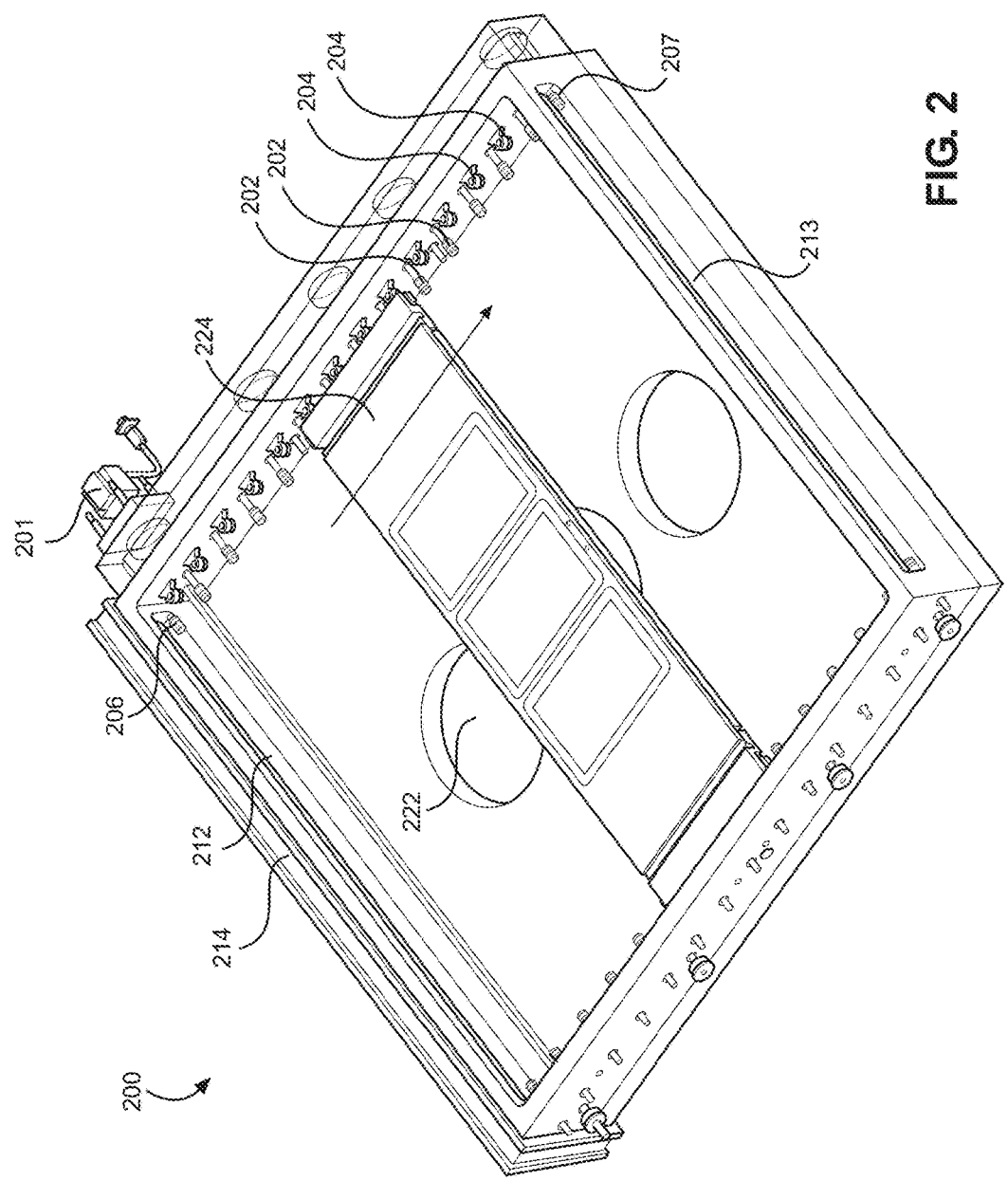
FIG. 2 illustrates an embodiment of a vacuum processing chamber 200 with the sputtering source removed for illustration.

FIG. 2 illustrates an embodiment of a vacuum processing chamber 200 that may be used with the disclosed system and sputtering source. In the illustration of FIG. 4, the lid of the chamber with the sputtering source is removed to expose its internal construction. The chamber 200 may be installed in a horizontal or vertical orientation, without any modifications to its constituents or its construction. The chamber is constructed of a simple box frame with openings 222 for vacuum pumping. An entry opening 212 is cut in one sidewall, while an exit opening 213 is cut in the opposite sidewall, to enable the carrier 224 to enter the chamber, traverse the entire chamber, and exit the chamber from the other side. Gate valves are provided at each opening 212 and 213, although for clarity in the illustration of FIG. 2 only gate valve 214 is shown.

To enable efficient and accurate transport of the carrier 224 in a horizontal and vertical orientation, magnetic wheels 202 are provided on the opposing sidewall of the chamber. The carrier has magnetic bars that ride on the magnetic wheels 202. The shafts upon which the wheels 202 are mounted extend outside the chamber into an atmospheric environment, wherein they are motivated by motor 201. Specifically, several motors 201 are provided, each motivating several shafts using belts, e.g., O-rings. Also, idler wheels 204 are provided to confine the carriers laterally.

A feature of the embodiment of FIG. 2 is that the diameter of the magnetic wheels is smaller than the chamber's sidewall thickness. This enables placing magnetic wheels inside the inlet and outlet openings 212 and 213, as shown by wheels 206 and 207. Placing wheels 206 and 207 inside the inlet and outlet opening 212 and 213 enables smoother transfer of the carriers into and out of the chamber, as it minimizes the gap that the carriers have to traverse without support from wheels.

As can be understood, the system described thus far is inexpensive to manufacture and provide efficient vacuum processing of various substrates, such as, e.g., solar cells, touchscreens, etc. The system can be configured with double or single end loading and unloading, i.e., substrate loading and unloading from one side, or loading from one side and unloading from the opposite side. No substrate handling is performed in vacuum. The system is modular, in that as many vacuum processing chambers as needed may be installed between the input and output loadlocks. The vacuum chambers have a simple design with few parts in vacuum. The vacuum chambers may be installed in a horizontal or vertical orientation. For example, for solar cell processing the system may process the substrates in a horizontal orientation, while for touchscreens the substrates may be processed in a vertical orientation. Regardless, loading, unloading and transport in atmospheric environment is done with the substrates in a horizontal orientation. The processing sources, e.g., sputtering sources, may be installed above and/or below the substrates. The system is capable of pass-by or static processes, i.e., with the substrate stationary or moving during vacuum processing. The chambers may accommodate sputtering sources, heaters, implant beam sources, ion etch sources, etc.

For solar applications the vacuum chamber may include a low energy implanter (e.g., less than 15 KV). For specific solar cell design, such as PERC, IBC or SE, the mask arrangement may be used to perform masked implant. Also, texture etch may be performed with or without mask, using an ion etch source or laser assisted etch. For point contact cells, masks with many holes aligned to the contacts can be used. Also, thick metal layers can be formed by serially aligning several PVD chambers and forming layers one over the other serially.

For touch panel applications, the chambers may be used to sputter deposit cold and/or hot ITO layers using sputtering sources disclosed below. The processing is performed with several, e.g., three touch panels arranged widthwise on each carrier, and several, e.g., two, carriers positioned inside each chamber simultaneously for higher throughput but simpler handling. The same system can handle touchscreens for pads or cellphone size glass without any internal reconfigurations. Simply, the appropriate carrier is configured and the entire system remains the same. Again, no substrate handling is performed in vacuum.

The handling and processing operations can be the same for all types and sizes of substrates. An empty carrier moves to load from carrier return elevator. If a mask is used, the mask is removed and stays at the elevator. Substrates are loaded onto the carrier in atmospheric environment. The carrier moves back to the elevator and the masks are placed on top of the substrates. The carrier then moves into the load lock. In vacuum the carrier transport is via simple magnetic wheels positioned in chamber wall and energized from outside the chamber in atmospheric or vacuum environment. The chambers can have valves for isolation, and can have sources above or in a drawer for process below the substrates. The substrates can be removed at an unload end of the system, or left on carriers to return to the loading end, i.e., entry side of the system. Carriers return on simple conveyor belt from process end of the system to load end of the system. Simple pin conveyor lifts or lowers the carriers to or from load and unload stations.

Figure 3A:
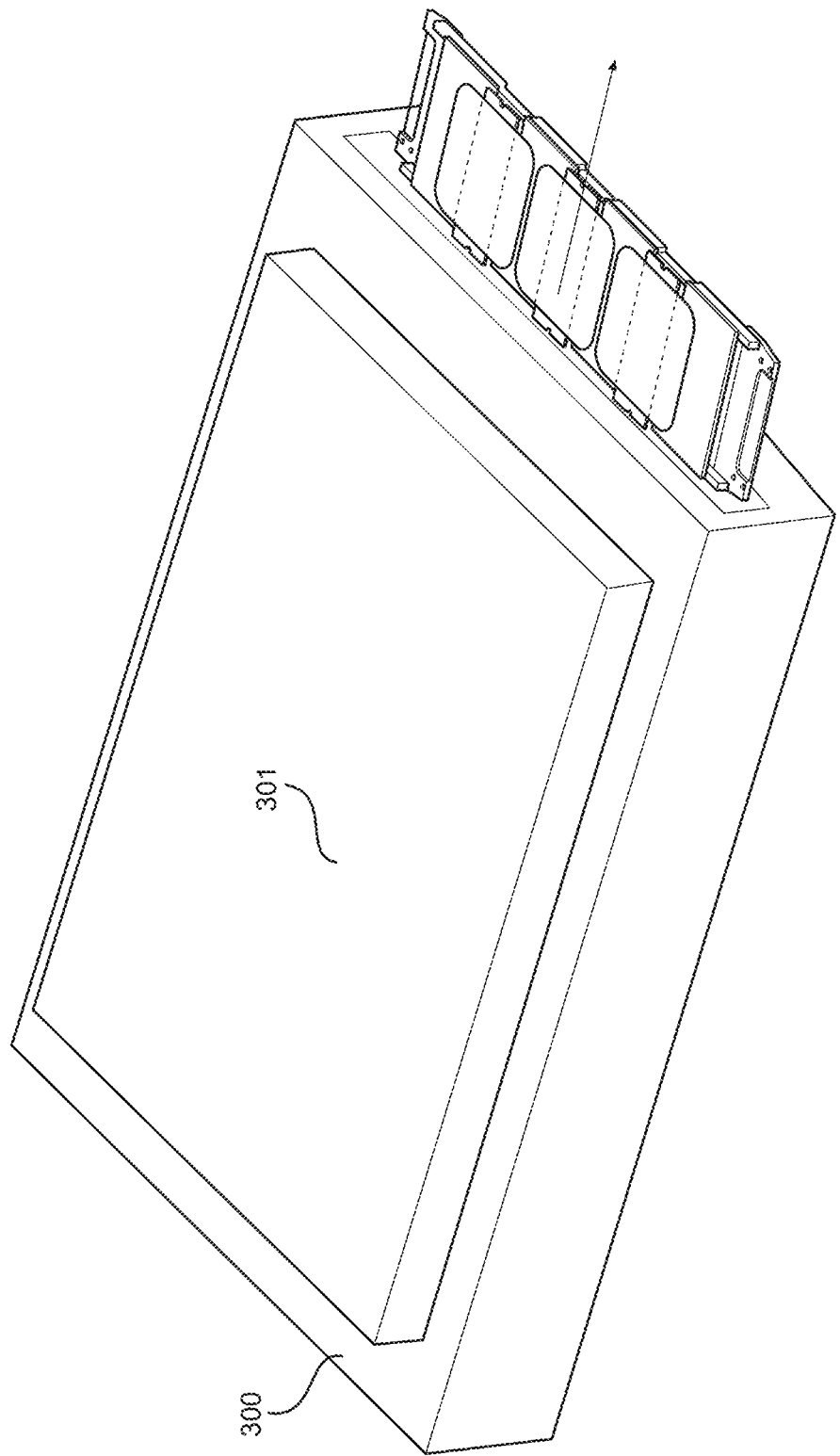
FIG. 3A illustrates an embodiment of the sputtering chamber having a standard sputtering source.
Figure 3B:
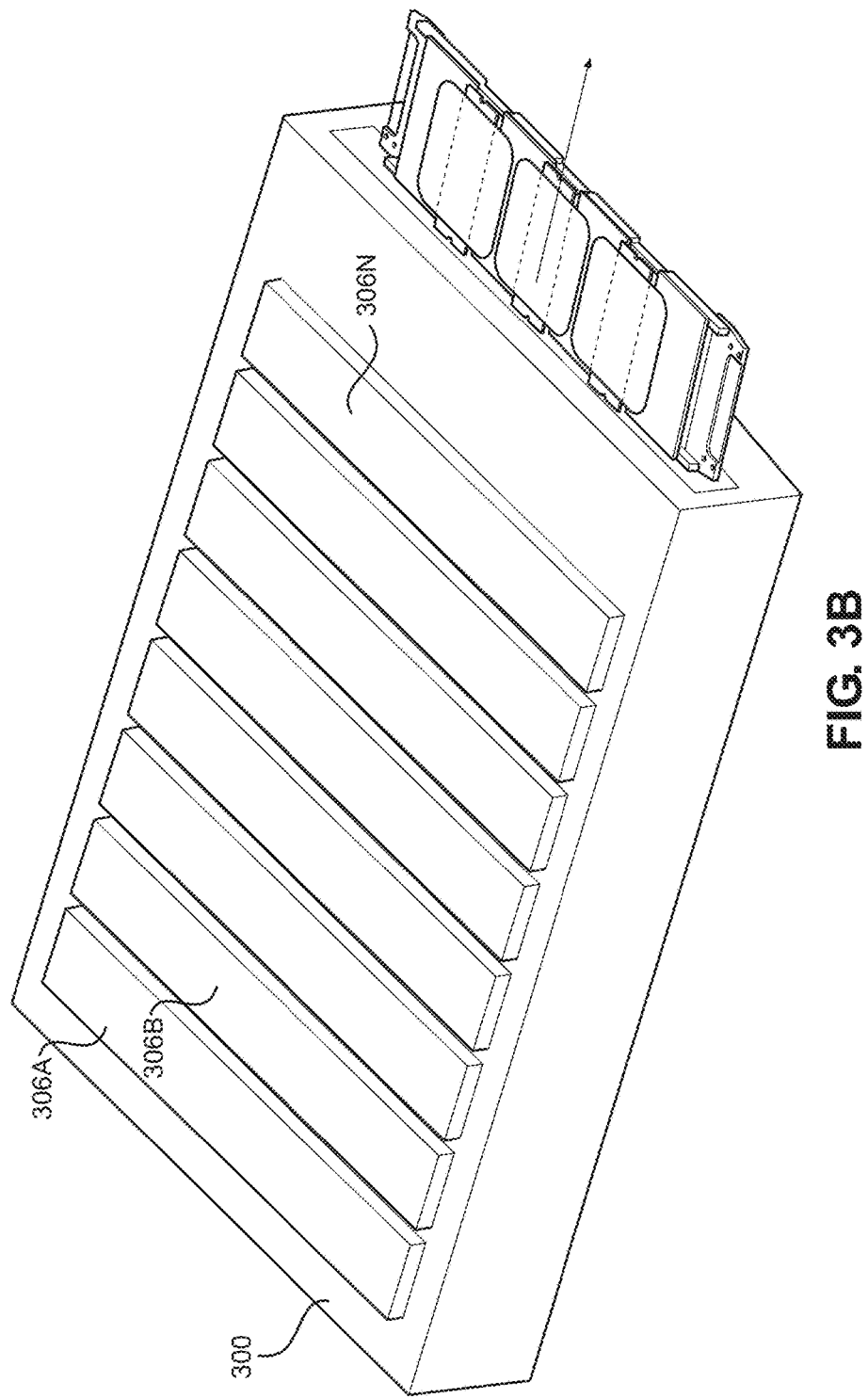
FIG. 3B illustrates an embodiment of the sputtering chamber fitted with sputtering sources according to the disclosed embodiments.

FIG. 3A illustrates an embodiment wherein a single source 301 is provided on chamber 300. This single source is used to process all of the substrates positioned inside the chamber 300, whether a single large substrate or several smaller substrates. The source 301 has length and width that covers the entire single large substrate or all of the multiple smaller substrates simultaneously. Such a large source is too complicated and too expensive to fabricate due to its large size. Also, a sputtering target made for such a large sputtering source must be very large, which is expensive, complicated, and leads to under-utilization. Therefore, according to the embodiments of FIG. 3B several narrow sources are used together to cover the required sputtering area. In the embodiment of FIG. 3B each of the sources 306A-306$n$ is long enough to traverse the entire span of sputtering in one direction, but is very narrow in the orthogonal direction of substrate travel. In fact, in some embodiments, each of the sources 306A-306$n$ is even narrower than one substrate. Such an arrangement is equally suitable for pass-by or static processing.

FIGS. 4A and 4B provide a cross-section and an isometric view of one sputtering target according to one embodiment. As illustrated, the source 400 comprises an elongated housing 405, which may be made of, e.g., stainless steel. In this context, the front of the source is considered the side of the source where the target 445 is installed, while the rear of the source is considered the side opposite of where the target is installed. As shown in FIG. 4A, the front of the housing 405 is open, and the sides are bent inwardly and extend just slightly towards the open front side of housing 405. That is, housing 405 may be formed by taking a flat sheet of metal, bending two sides so as to form a bottom with two sidewalls, and then bending the edges of the sidewall inwardly, such that they extend inwardly to partially traverse the front, but leaving an opening. That is, the front of the housing includes short extensions 407 traversing the entire length of the housing 405.

A heat sink 410 is provided inside the housing 405, and is sized to move freely front to back, as shown by the double-headed arrow 455. The front side of the heat sink 410, i.e., the side of the heat sink facing the target 445, supports a seal. In the embodiment of FIG. 4A, the front side of heat sink 410 has a trench in which an O-ring 420 is embedded. A magnetic pole 415 is provided inside the housing 405, and is situated behind the heat sink 410. The magnetic pole 415 is mechanized to scan from side to side in the linear direction illustrated by double-headed arrow 460, and to scan end-to-end, i.e., in and out of the page of FIG. 4A, as illustrated by the markings 465. According to another embodiment, to increase inventory and target utilization the magnetic pole 415 is slowly and continuously scanned a short distance (about 10 mm) at an angle of about 50 degrees. This spreads out the erosion groove thereby greatly improving utilization and inventory.

The target 445 may be made of a single material which is to be sputtered on the substrate. For example, when the sputtering chamber is used for depositing a layer of aluminum, the target 445 may be simply made of extruded aluminum, which is a simple and cheap process. The target has a cross-sectional provide which includes a notch 447, sized so as to enclose the extensions 407 therein in a sliding fashion, akin to a drawer.

The back of the housing 405 further includes a pneumatic inlet 425, enabling pneumatic pressure build-up inside the housing. Specifically, once the target 445 is inserted into the housing by sliding it so that the extensions 407 are inside the notches 447, pneumatic pressure is provided from inlet 425, such that the pressure pushes the heat sink 410 forwards. Consequently, the heat sink presses against the target 445. This has several benefits. First, it prevents the target 445 from moving/sliding. Second, it forms a tight physical contact between the target 445 and the heat sink 410, providing good thermal conductivity. Third, the pneumatic pressure can be generated using gas which may further enhance thermal conductivity. Alternatively or additionally, to enhance thermal conductivity, gas may be pumped into the void between the target and the heat sink and defined by the seal, as noted by broken-line rectangle 417. The gas can be delivered via a separate gas inlet 419. To replace the target 445, the pressure is simply released and the used target is slid out and a new one is slid in. This makes replacement of a target, normally an arduous task, simple as opening and closing a drawer.

As can be understood, when other target materials are needed, if the material is inexpensive and can be extruded, then the entire target is made by extruding from the sputtering material. However, if the material is expensive or cannot be extruded, such as, e.g., an ITO, then a flat solid of the target material can be adhered to the front surface 448 of target 445, as illustrated by the broken-line rectangle 449.

FIG. 4C is a close-up of a heat sink arrangement according to another embodiment, which utilizes fluid cooling. In FIG. 4C, a thin (e.g., 0.005" or so) metal membrane 460 is bonded or welded to the face of the heat sink 410. An enclosed space 462 is formed between the metal membrane 460 and the heat sink 410 where a thermal transfer gas or fluid can be flown to assist in thermal transfer. The thermal transfer fluid or gas is coupled to a reservoir 464, which is open to atmosphere, but is isolate from vacuum by the weld or bond of the metal membrane 460.

The use of the membrane is beneficial at least for the following reasons. That is, if the target is not perfectly planer or if it warps for any reason, the membrane will deflect under the atmospheric pressure from reservoir 464, so to keep the thermal transfer media in contact with the target. Without this feature small areas of non-contact become very hot leading to greater deflection and larger areas of non-contact.

FIG. 4D is a close-up of a heat sink arrangement according to yet another embodiment. In FIG. 4D, a thermal transfer media 463, such as grafoil or other type heat transfer pad, is adhered to the heat sink 410, such that when the heat sink 410 is urged against the target 445 by pneumatic pressure, the thermal transfer pad 463 is squeezed between the heat sink 410 and the target 445. The thermal transfer media 463 is adhered to the movable heat sink 410, so that it would stay with the sputtering source, not the target. Therefore, when the target 445 is replaced, the thermal transfer media 463 is reused.

Another feature illustrated in FIG. 4D is the use of fluid for active cooling of the heat sink. Fluid channels 467 are provided inside the heat sink 410, and are connected to cooling fluid reservoir 466, which may or may not include a heat exchanger. The fluid may be circulated inside the heat sink to remove the heat.

The features of thermal transfer media 463 and active fluid cooling 467 can be used in any of the other embodiments disclosed herein. For example, FIG. 4E illustrates a combination of the features of FIGS. 4C and 4D, wherein the thermal transfer media 463 is adhered to the front surface of the membrane 460. Also, the active fluid cooling is incorporated to enhance heat removal from the heat sink 410.

As explained above, the target can be fabricated by extrusion, providing targets for sputtering metals, such as copper or aluminum, or could be fabricated by machining from bar stock. The target is not bonded to the heat sink as is done in the prior art, but is rather cooled by a heat sink which is pneumatically pressed into tight contact with the target. There is an O-ring seal on the front of the heat sink that creates a vacuum tight seal on the back side of the target. This space between the target and the heat sink can be filled with a conductive gas to increase the cooling rate. To change targets, the pneumatic pressure is released and the target simply slides out of the assembly. There are minimal or no screws required to disassemble the source for target replacement.

In some embodiments, the sputtering linear magnetron is very narrow, less than 100 mm wide, or in some cases 70-75 mm wide, so that multiple sources can be mounted in a row on the chamber without creating an extremely long tool. For example, in order to deposit a 2 um thick film, about 30 sources will be required in order to have enough target inventory, to keep power supplies under 10 kW, and to control substrate heating. For the compact source described, the required length would be about 2.5 meters. Configuring the target to have a width of no more than 100 mm, or more specifically, 70-75 mm, was found to be beneficial in that it makes forming the target very easy and cheap using efficient techniques, such as extrusion or milling from stock bars.

Embodiments described herein provide sputtering source for a sputtering chamber, the sputtering chamber having a sputtering zone having zone width and zone length, the zone length defined in the direction of substrate travel, the sputtering source comprising: an elongated body having width substantially narrower than the zone length, the elongated body having a cross-sectional profile consisting of a back wall, two sidewalls extending forward from the back wall, and two extensions, each extension orthogonally emanating from one of the sidewalls and extending inwardly such that the two extensions define an elongated opening between the extensions throughout the length of the elongated body; an elongated heat sink provided inside the elongated body and configured to freely move towards and away from the extensions; an elongated magnetic pole provided inside the elongated body and positioned between the elongated heat sink and the back wall, the elongated magnetic pole configured for scanning motion between the two sidewalls; and, a pneumatic inlet provided at the back wall and configured for delivering pneumatic pressure to urge the elongated heat sink towards the extensions. An elongated target slidably attaches to the elongated body, the target having two grooves that extend over length of the target, each groove provided on one side of the elongated target and configured for accepting one of the extensions. The elongated heat sink includes a seal, the seal is configured to be pressed against backside of the target when pneumatic pressure is provided via the pneumatic inlet so as to urge the elongated heat sink towards the extensions and against the backside of the target. A gas inlet may be included, enabling delivery of gas to a void or space defined by the backside of the target, the elongated heat sink, and the seal, wherein the gas serves to increase thermal conductivity between the elongated heat sink and the elongated target. The elongated magnetic pole may be configured to scan in a direction oblique to the direction of substrate travel, so as to increase target utilization.

The embodiments described above provide for a vacuum processing chamber having a vacuum housing sized for housing and processing one large or several small substrates simultaneously. The housing is also configured for supporting several narrow sputtering sources simultaneously. The narrow sputtering sources have length sufficient to traverse the entire width of a sputtering zone, but are much narrower than the length of the sputtering zone. In some embodiments the narrow sputtering sources have width that is narrower than the width of the substrate to be processed. Several such sources may be positioned back-to-back over the entire or part of the length of the chamber in the travel direction of the carrier. In one embodiment the sources are placed far enough from the substrate such that sputtering material from two neighboring sources overlap and cancel the effect of any separation between the sources. According to another embodiment, a pass-by processing is performed, such that as the substrates pass by the targets they get coated by each narrow source and any separation between the sources has no effect on the coating.

As also described, a sputtering chamber for depositing target material on substrates is provided, comprising: a chamber body defining an processing space for processing substrates in vacuum over a processing zone, the chamber body having a sidewall, the sidewall configured for accepting a plurality of sputtering sources; a plurality of sputtering sources attached to the sidewall and abutting each other in a row, each of the sputtering sources comprising: a narrow elongated sputtering source comprising a narrow enclosure having an opening traversing entire length of the enclosure; an elongated target slidably attached to the enclosure over the opening; and, a heat sink positioned inside the enclosure and configured to contact backside of the elongated target so as to remove heat from the elongated target.

According to the disclosed embodiments, a system for processing substrates is disclosed, comprising a plurality of sputtering chambers attached one to another in a linear fashion, such that substrates exit one chamber and enter the next chamber directly. The system has an entry load lock, attached to the first sputtering chamber, for delivering substrates into vacuum environment. The system also has an exit load lock, attached to the last sputtering chamber, for removing substrates from the vacuum environment and into atmospheric environment. Each of the sputtering chamber is configured for mounting plurality of narrow sputtering sources, such that the plurality of narrow sputtering sources cover the entire sputtering zone of the sputtering chamber. In some embodiments, each of the narrow sputtering sources is narrower than a substrate to be processed inside the sputtering chamber, such that each substrate inside the sputtering chamber is coated with material sputtered simultaneously from at least two abutting narrow sputtering sources.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A sputtering source for a sputtering chamber, the sputtering chamber having a sputtering zone having zone width and zone length, the zone length defined in the direction of substrate travel, the sputtering source comprising:
   an elongated body having width substantially narrower than the zone length, the elongated body having a cross-sectional profile consisting of a back wall, two sidewalls extending forward from the back wall, and two extensions, each extension orthogonally emanating from one of the sidewalls and extending inwardly such that the two extensions define an elongated opening between the extensions and traversing a length of the elongated body;
   an elongated target having two elongated grooves traversing the length of the elongated body, one on each side of the elongated target, the elongated target slidably attached to the elongated body over the elongated opening, the elongated target being planer;
   an elongated heat sink provided inside the elongated body and configured to freely move towards and away from the extensions;
   an elongated magnetic pole provided inside the elongated body and positioned between the elongated heat sink and the back wall, the elongated magnetic pole configured for scanning motion between the two sidewalls in a linear direction; and,
   a pneumatic inlet provided at the back wall and configured for delivering pneumatic pressure to press the elongated heat sink towards the extensions;
   wherein the two extensions are configured to extend into the two elongated grooves.

2. The sputtering source of claim 1, wherein the elongated heat sink includes a seal, the seal configured to be pressed against backside of the elongated target when pneumatic pressure is provided via the pneumatic inlet to press the elongated heat sink towards the extensions and against the backside of the elongated target.

3. The sputtering source of claim 2, further comprising a gas inlet enabling delivery of gas to a void defined by the backside of the elongated target, the elongated heat sink, and the seal, wherein the gas serves to increase thermal conductivity between the elongated heat sink and the elongated target.

4. The sputtering source of claim 1, wherein the elongated target comprises extruded metal.

5. The sputtering source of claim 4, wherein the elongated target comprises extruded copper or extruded aluminum.

6. The sputtering source of claim 1, wherein the elongated target comprises metal machining from bar stock.

7. The sputtering source of claim 1, wherein the elongated magnetic pole is configured to scan in a direction oblique to the direction of substrate travel.

8. A sputtering chamber for depositing target material on substrates, comprising:
   a chamber body defining a processing space for processing substrates in vacuum over a processing zone, the chamber body having a sidewall, the sidewall configured for accepting a plurality of sputtering sources;

a plurality of sputtering sources attached to the sidewall and abutting each other in a row, each of the sputtering sources comprising:

a narrow elongated sputtering source comprising a housing consisting of a sheet of metal bent so as to form a cross-sectional profile consisting of a back wall, two sidewalls extending orthogonally forward from the back wall, and two extensions, each extension orthogonally emanating from one of the two sidewalls and extending inwardly such that the two extensions define an opening traversing a length of the housing;

an elongated target having two elongated grooves traversing the length of the housing, one on each side of the elongated target, the elongated target slidably attached to the housing over the opening, the elongated target being planer;

a heat sink positioned inside the housing and having front side configured to contact backside of the elongated target so as to remove heat from the elongated target, the heat sink sized to move freely front to back;

a magnetic pole positioned inside the housing behind the heat sink, the magnetic pole being mechanized to scan from side to side in a linear direction;

wherein the two extensions are configured to extend into the two elongated grooves.

9. The chamber of claim 8, wherein the housing further comprises inlet for accepting pneumatic pressure, and wherein the heat sink is configured to be pressed against the backside of the elongated target by the pneumatic pressure.

10. The chamber of claim 9, wherein the heat sink includes a seal facing the backside of the elongated target.

11. The chamber of claim 10, wherein the seal comprises an O-ring defining an interior space between the backside of the elongated target and the heat sink, and wherein the housing further comprises a gas inlet for flowing gas into the interior space.

12. The chamber of claim 8, wherein the elongated target has a width of no more than 100 mm.

13. The chamber of claim 12, wherein the elongated target has a width of 70-75 mm.

14. The chamber of claim 8, wherein the chamber body is sized to house and simultaneously process a two-dimensional array of substrates.

15. The chamber of claim 14, wherein each elongated target has width that is smaller than width of a single substrate.

16. The chamber of claim 14, further comprising a plurality of substrate carriers, each substrate carrier supporting a one-dimensional array of substrates.

17. The chamber of claim 8, wherein the elongated target comprises extruded aluminum or extruded copper.

18. The chamber of claim 8, further comprising a thermal transfer media adhered to front surface of the heat sink.

19. The chamber of claim 8, further comprising a thin membrane welded to front surface of the heat sink and defining an enclosed volume between the front surface of the heat sink and the backside of the target, the enclosed volume being sealed from vacuum environment and having conduit to atmospheric environment.

20. The chamber of claim 8, further comprising a fluid conduit formed inside the heat sink and having thermal transfer fluid within the fluid conduit.

* * * * *